United States Patent [19]

Umemura

[11] Patent Number: 5,243,291
[45] Date of Patent: Sep. 7, 1993

[54] ELECTROMAGNETIC CONTACTOR DEPOSITION DETECTING APPARATUS WHICH DETECTS LOAD CURRENT AND SWITCH CURRENT

[75] Inventor: Heihachiro Umemura, Sakai, Japan
[73] Assignee: Shinkoh Electric Co., Ltd., Osaka, Japan
[21] Appl. No.: 775,091
[22] Filed: Oct. 11, 1991
[51] Int. Cl.$^5$ .................. H02H 3/00; G01R 33/02; G01R 31/32
[52] U.S. Cl. ................... 324/418; 324/537; 340/644; 361/93; 361/31
[58] Field of Search ............. 324/418, 424, 537; 340/644; 361/93, 96, 160, 31

[56] References Cited

U.S. PATENT DOCUMENTS 4,689,570 8/1987 Ohgaki et al. .................. 324/418

FOREIGN PATENT DOCUMENTS 2162391 1/1986 United Kingdom .

*Primary Examiner*—Walter E. Snow
*Attorney, Agent, or Firm*—Wenderoth, Lind & Ponack

[57] ABSTRACT

A circuit is provided for detecting the deposition of an electromagnetic contactor which opens and closes a drive circuit connecting a power source to a load. A load current of the drive circuit and an operating current for operating the electromagnetic contactor are detected and applied to a detection circuit. The thus detected load current and operating current are used to determine the deposition of the electromagnetic contactor. Further, in the event of a detected malfunction in the electromagnetic contactors, a breaker of the drive circuit is automatically opened.

5 Claims, 5 Drawing Sheets

ELECTROMAGNETIC CONTACTOR DEPOSITION DETECTING APPARATUS WHICH DETECTS LOAD CURRENT AND SWITCH CURRENT

BACKGROUND OF THE INVENTION

1. Field of the Invention

This invention relates to a deposition detecting apparatus which automatically detects the deposition of an electromagnetic contactor, a relay, an inverter or the like (hereinafter referred to as "electromagnetic contactor") and which opens an electric circuit in accordance with the detected electromagnetic contactor deposition.

2. Description of the Prior Art

High-tension heavy current is used for driving the motors of large processing machines, such as hoist cranes. Therefore, in opening and closing a driving circuit for a motor, etc., a push-button switch is used for remote-controlling an electromagnetic contactor or a similar switch. However, the life the electromagnetic contacts depends upon the frequency of use, values of tension and current, etc. Especially in three-phase power sources, when any one of the three phases has a bad connection, only the other two phases are connected to the load resulting in the so-called single-phase running which can cause damage, and when contacts of the electromagnetic contactor become fused together, "runaway" running results which can cause much damage to both persons and objects.

In view of the above, the Japanese Utility Model Registration Application Laying Open Gazette No. 63-121337, for example, disclosed a circuit for detecting the deposition (fusing together) of contacts of a relay using a sequence circuit.

In the above conventional contact deposition detecting apparatus for an electromagnetic contactor, an electric circuit of the apparatus is in parallel with a driving circuit. Therefore, a driving current flows in the electric circuit and it is difficult to electrically separate them from each other. Thus, when the detecting apparatus has malfunctioned, it has bad influence upon the driving circuit. With this in mind, it has been the practice to set a permissible time for usage of each electromagnetic contactor and to change contactors with new ones after their use for this permissible time. This, however, involves un-economical use of contactors because some are still safely usable at the time of change.

SUMMARY OF THE INVENTION

The present invention has been made to solve the above problems and has for its object to provide a novel contact deposition detecting apparatus for an electromagnetic contactor which is durable, which can allow the contactors to be used as long as their usable life limit, which detects any malfunction, such as fusing together of contacts, as soon as such malfunction occurs, and which is electrically separate from a driving circuit.

According to one aspect of the invention for achieving the above object, a deposition detecting apparatus for an electromagnetic contactor is provided with a load current sensor which detects supply current to a load and which is provided in a power source circuit connecting a power source with a load, an operation circuit sensor which is provided in an operation circuit for opening and closing a relay of the power source circuit, and a deposition detecting circuit which receives detecting signals from each sensor. Each sensor is composed of a current transformer and impresses upon the deposition detecting circuit the secondary current of each current transformer as a detecting signal for the driving current to the load and an operation current. The power source circuit is a three-phase alternating current circuit. The sensor for detecting load current is composed of a current transformer common to each phase, whereby a load current signal (including an open phase of the three-phase load) is detected by a single current transformer by making the number of turns of each phase different. The detected signal is compared with a driving current signal and if one of the signals varies independently of the other signal, such is detected and a signal is issued. The deposition detecting circuit has a detection time differential circuit for regulating the time from detecting to signalling and this detection time differential circuit causes an opening means of the power source circuit to issue an opening signal after the set time.

According to another aspect of the invention, a deposition detecting apparatus for a electromagnetic contactor is provided with a load current detecting circuit to detect a supply circuit to a load, an operation detecting circuit to detect a switching operation of a electromagnetic contactor to a load, a deposition detecting circuit to receive detecting signals from each detecting circuit, a relay for opening a main electromagnetic contactor of a driving power source circuit to a load, and a normally opened non-contact switch which is provided in series to the relay. The deposition detecting circuit causes the non-contact switch to conduct and works the relay when a signal from the load current detecting circuit stops and only signals from the load current detecting circuit are impressed, whereby the main electromagnetic contactor is made OFF at its B contact to open the power source circuit and an electrical holding circuit is composed by an A contact of the relay.

According to another aspect of the invention, in the deposition detecting apparatus for the electromagnetic contactor, a non-contact switch is composed of LED-CdS cells, the LED provided at the output side of the deposition detecting circuit side and the CdS provided in series to the opening relay and is kept in a conducting state by an output current from the deposition detecting circuit.

According to another aspect of the invention, in the deposition detecting apparatus for the electromagnetic contactor, the power source circuit is a three-phase alternating current circuit and the load current detecting circuit is composed of current transformers provided at each of two phases of the three-phase power source circuit, a composite circuit to combine the outputs of each current transformer and a circuit to detect existence or non-existence of conductivity from the combined output.

According to another aspect of the invention, in the deposition detecting apparatus for the electromagnetic contactor, the deposition detecting circuit is provided with a detection time differential circuit for regulating the time from detecting to signalling. The detecting time differential circuit causes the opening circuit of the electromagnetic. contactor to generate an opening signal.

When the above electromagnetic contactor works normally, namely, in the case where a push-button is opened and accordingly there is no output form a load current detecting circuiting, a deposition detecting circuit does not generate an output signal. In the case where deposition took place at the electromagnetic contactor, however, the push-button is made OFF and an operation circuit is opened, whereby even when a signal is not generated from the operation detecting circuit, the load current detecting circuit generates a signal and this signal alone is impressed upon the deposition detecting circuit. In this case, the deposition detecting circuit generates a signal to operate an opening means for the power source circuit for opening the power source circuit. At this time, by providing the deposition detecting circuit with a detection time differential circuit, even if there is a time differential between output signals from the load current detecting circuit and from the operation detecting circuit, no erroneous operation is caused.

BRIEF DESCRIPTION OF THE DRAWINGS

The nature and advantages of the present invention will be understood more clearly from the following description made with reference to the accompanying drawings, in which.

DETAILED DESCRIPTION OF THE INVENTION

Figure 1:
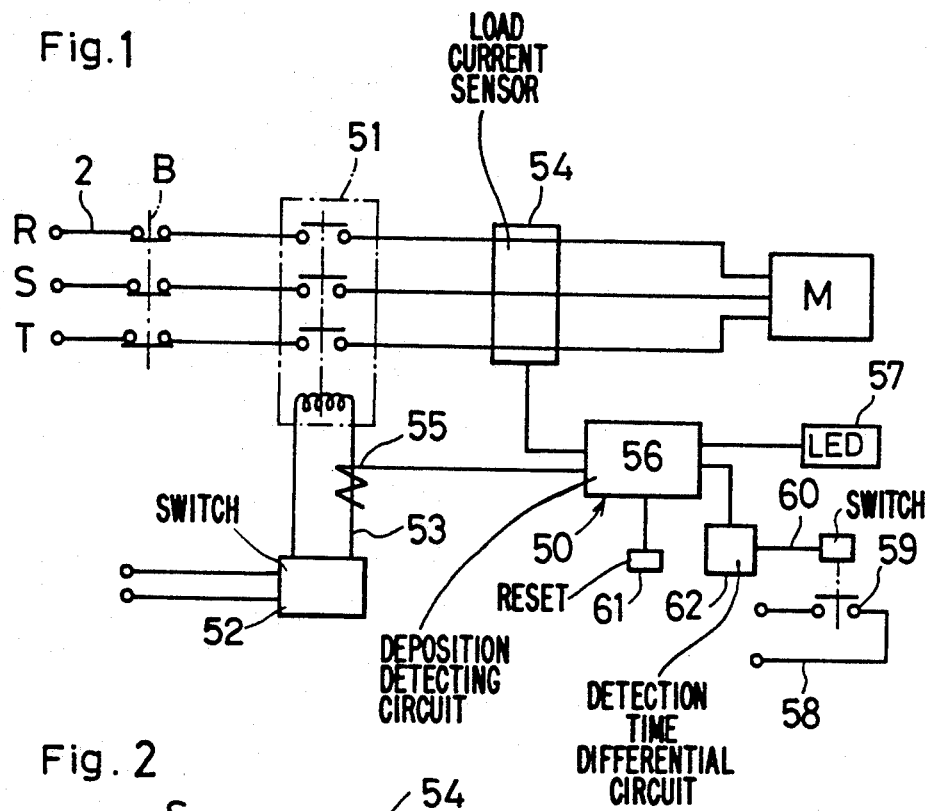
FIG. 1 is a circuit diagram of a deposition detecting apparatus of the first embodiment.

FIG. 1 shows the first embodiment of the present invention.

An electric circuit 2 provides a three-phase alternating current to a load M via a relay 51. The relay 51 is connected with and operated by a switch 52 via an operation circuit 53. An electromagnetic contactor deposition detecting apparatus 50 includes a load current detecting sensor 54 provided at the electric circuit 2, an operation detecting sensor 55 for detecting the operation of the operation circuit 53 and a deposition detecting circuit 56 which judges whether the relay 51 is faulty according to input signals from both the sensors 54 and 55. The deposition detecting circuit 56 is composed of an IC, for example, and is provided with apparatus for indicating when an abnormality occurs, for example, an information lamp 57, and a switch circuit 60 to open and close a contact 59 provided in a cutoff circuit 58 to open a breaker B.

Figure 2:
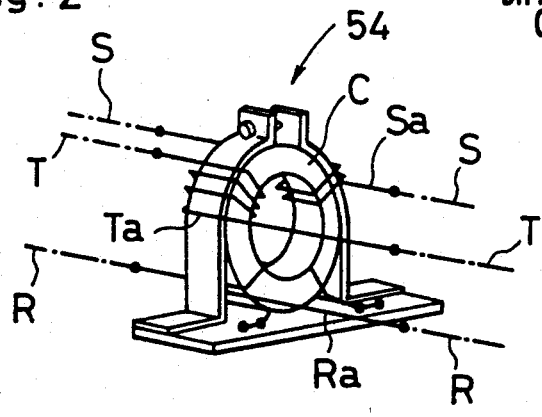
FIG. 2 is a perspective view of a load current detecting circuit.

The load current detecting sensor 54 is used to detect a fault in relay 51, even when only the relay contact of one of the three phases R, S and T of the above power source circuit 2 is malfunctioning. That is, the sensor 54 detects the existence or non-existence of conductivity in each phase using a single sensor for detecting load current. As shown in FIG. 2, the load current detecting sensor 54 is composed of a current transformer. To detect the existence or non-existence of conductivity in each phase R, S and T, three conductors Ra, Sa and Ta, which are respectively connected to each phase R, S and T, are wound in a different number of turns (one turn, two turns and three turns in FIG. 2) around a core C to generate different induced voltages at each phase. As is conventionally known, if each phase R, S, T is passed through a single winding of the core C, a voltage is not generated at the core C due to mutual cancellation of the phases. However, by differing the number of turns for each phase as according to the present invention, the induced voltage from each phase no longer balance each other. The deposition detecting apparatus 56 stores or advance this induced voltage inbalance and detects any variation in the induced voltages caused by an interruption of any one of the three phases.

The operation circuit 53 operates usually in a single phase and therefore the operation detecting sensor 55 is also a current transformer which generates an induced voltage.

Under the above arrangement, when the relay 51 is normally operative, an induced voltage signal from the operation detecting sensor 55 and induced voltage signals from the load current detecting sensor 54 are input to the deposition detecting circuit 56. If no induced voltage signal is generated by the operation detecting sensor 55, which indicates that the relay 51 is OFF, an OFF signal (i.e. no induced voltage) is generated by the load current detecting sensor 54.

In a state where any one of the contacts of the relay 51 is conducting badly due to "burning" or for some other reason, a varied induced output voltage from the load current detecting sensor 54, together with an induced output voltage from the operation detecting sensor 55, are impressed on the deposition detecting circuit 56. Alternatively, in a state where the switch 52 is opened and an OFF signal (i.e. no induced voltage) is received from the operation detecting sensor 55, if each contact of the relay 51 is not opened accurately and plural contacts are in a connected state, an induced voltage signal is applied to the deposition detecting circuit 56 only from the load current detecting sensor 54. In either state, the deposition detecting circuit 56 lights up the information lamp 57, operates the contact opening circuit 60, closes the contact 59 to a cutoff circuit 58 and opens the power source circuit 2 by opening the breaker B. This condition is maintained until the deposition detecting circuit 56 is restored by operating a reset switch 61.

In order to set a time for confirming that only signals from the sensor 54 are applied to the deposition detecting circuit 56, a detection time differential circuit 62 is provided which can externally regulate the set time. After the lapse of the set time, the contact opening circuit 60 is operated.

In FIG. 2, it is shown that each phase R, S and T is wound by one turn, two turns and three turns, respectively around the core C, but it is also possible that any one of the three phases (the R phase, for example) may be stretched without regard to the core C, with the S phase and T phase wound around the core C in a different number of turns.

When an overload is applied to the driving motor M and a output voltage of the load current detecting sensor 54 rises abnormally, the deposition detecting circuit 56 can detect the overload and on the basis of this detection, the cutoff circuit 58 is put in a conductive state and the breaker B is opened.

Figure 3:
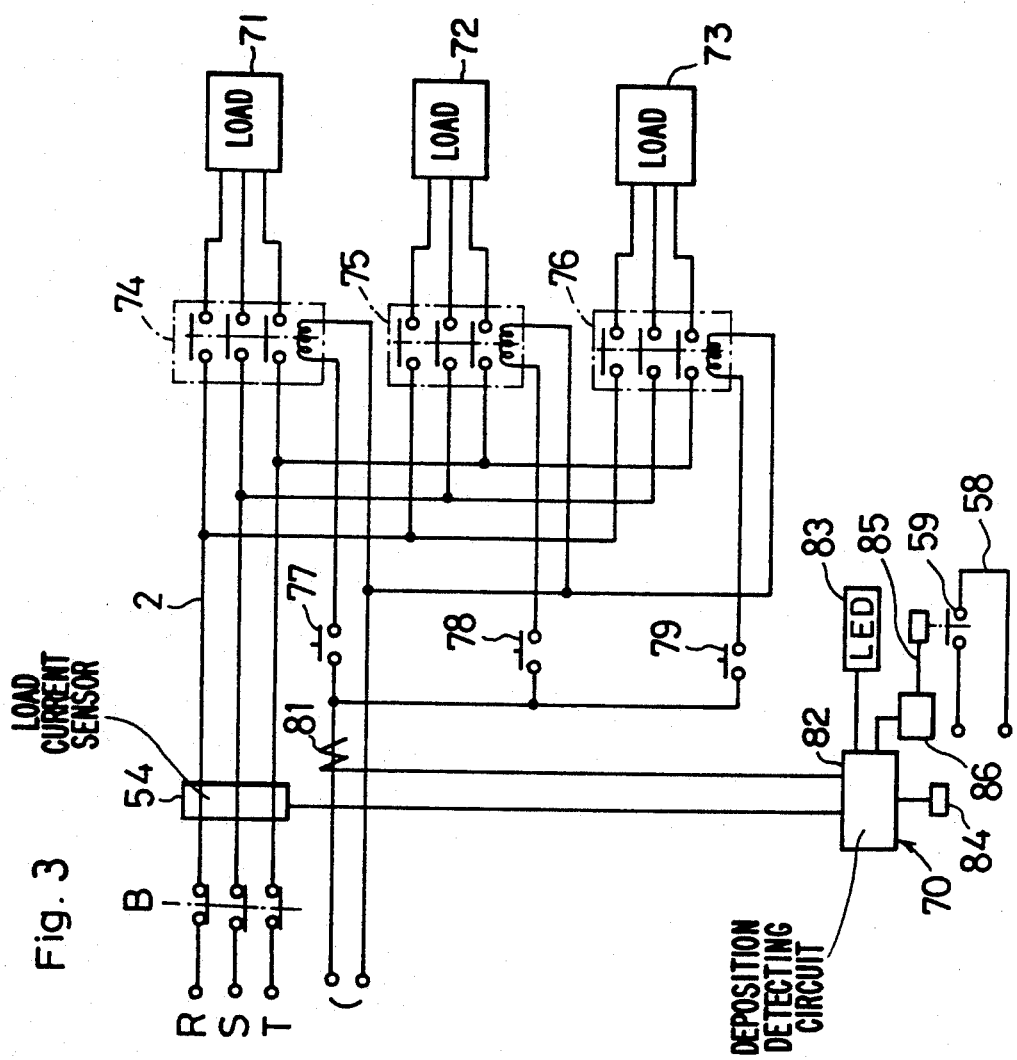
FIG. 3 is a circuit diagram of a deposition detecting apparatus of the second embodiment.

FIG. 3 shows the second embodiment of the present invention.

In this embodiment, any malfunction of relays 74, 75 and 76 to plural loads (three in FIG. 3) 71, 72 and 73, respectively, is automatically detected by a deposition apparatus 70. The deposition detecting apparatus 70 includes load current detecting sensor 54 (similar to the preceding embodiment), an operation detecting sensor 81 (similar to the preceding embodiment) which is provided opposite to a common operation circuit 80 having switch buttons 77, 78 and 79 connected in series, and a deposition detecting circuit 82. Reference numerals 83 and 84 designate an information lamp and a reset push-button respectively. Reference numeral 85 designates a switch circuit for the contact 59 provided in the cutoff circuit 58.

In the above arrangements, a faulty operation of the relay 74, for example, is judged by detecting electric current flowing in the common operation circuit 80 after closing the push button 77 and detecting the induced voltages of the load current detecting sensor 54. If the relay 74 is judged to be faulty, the breaker B provided in the common power source circuit 2 is opened to protect the load. In this embodiment, a detection time differential circuit 86 is also provided in the deposition detecting circuit 82 and the breaker B is opened after the lapse of a set time.

Figure 4:
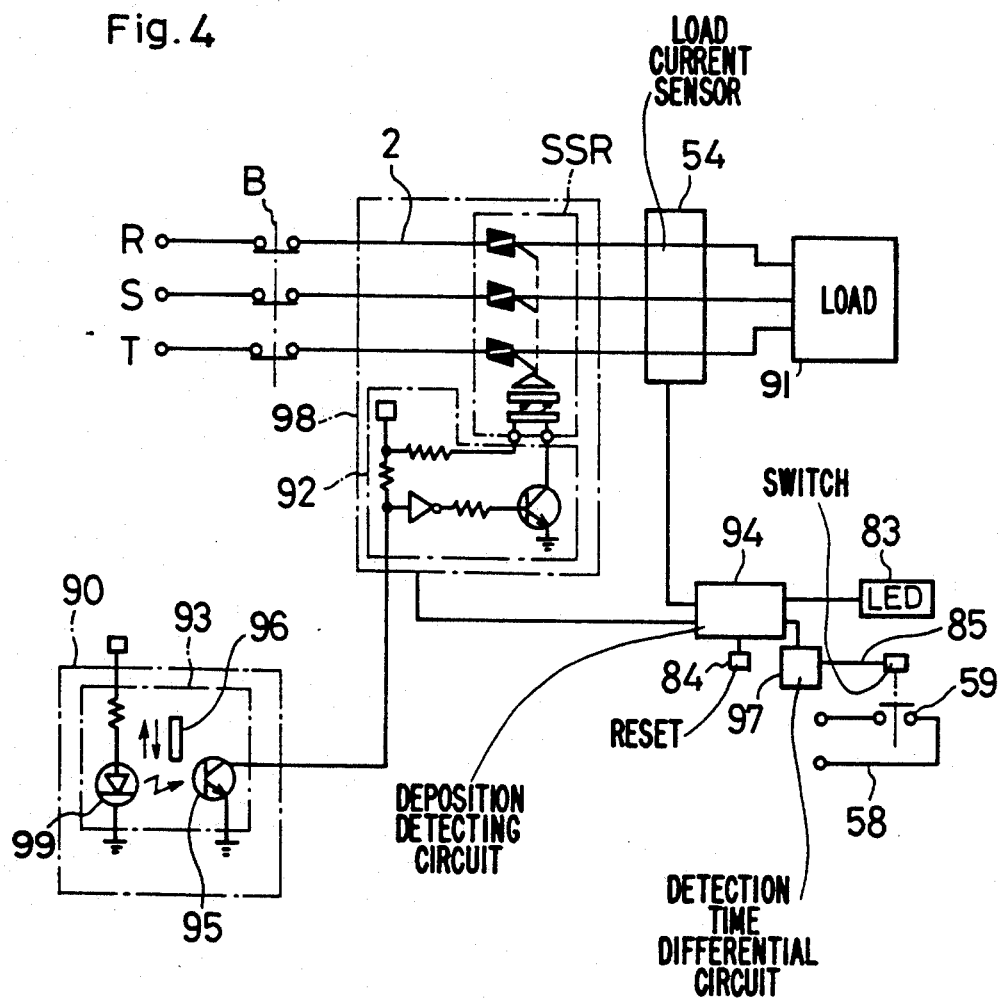
FIG. 4 is a circuit diagram of a deposition detecting apparatus of the third embodiment.

FIG. 4 shows the third embodiment of the present invention.

In the preceding embodiment, the drive current flowing in the power source circuit 2 and operation current flowing in the operation switch circuit to the relay are respectively detected and both detection signals are input to the deposition detecting circuit. In this third embodiment, however, the operation detecting sensor 55 is omitted and input signals for operating the relay SSR are input directly to the deposition detecting circuit. This arrangement is most suitable for the case where the relay SSR of the power source circuit 2 is opened and closed by using a light shielding type switch, for example. It is not suitable for carrying out the detection of the secondary side by the relay because a voltage is generated at the secondary side of the relay SSR of the power source circuit due to the influence of leakage current, even if input signals of the SSR are in an OFF state. A deposition detecting apparatus 90 of this embodiment comprises the load current detecting sensor 54 (similar to the preceding embodiment) provided in the power source circuit 2 connected to a load 91, the relay SSR for opening and closing the circuit 2, an interface circuit 92, a switch device 93 and a deposition detecting circuit 94. Outputs of the deposition detecting circuit 94 are impressed on the switch circuit 85 via a detection time differential circuit 97.

The switch device 93 is a non-contact light shielding type switch. This switch device includes a light emitting element 99, a light receiving element 95 and a light shielding plate 96 which is interposed between the two elements 94 and 95 and which is shifted to and from a light shielding position. A switch signal becomes an input signal of the relay SSR via the interface circuit 92 in a control box 98 and is input to the deposition detecting circuit 94.

In the above arrangement, the detecting signals from the load current detecting sensor 54 and switch closing signals from the switch device 93 are compared at the deposition detecting circuit 94 to judge whether the relay SSR is good or bad. If a fault occurs, the cutoff circuit 58 is closed immediately and the power source circuit 2 is opened. In this case, also, operations are made more accurate by providing the detection time differential circuit 97.

In this embodiment, a non-contact type switch device is adopted to operate the relay for opening and closing the power source circuit. However, a contact type switch can be used, in which case a relay operating signal is applied to the deposition detecting circuit upon operation of the relay SSR.

Figure 5:
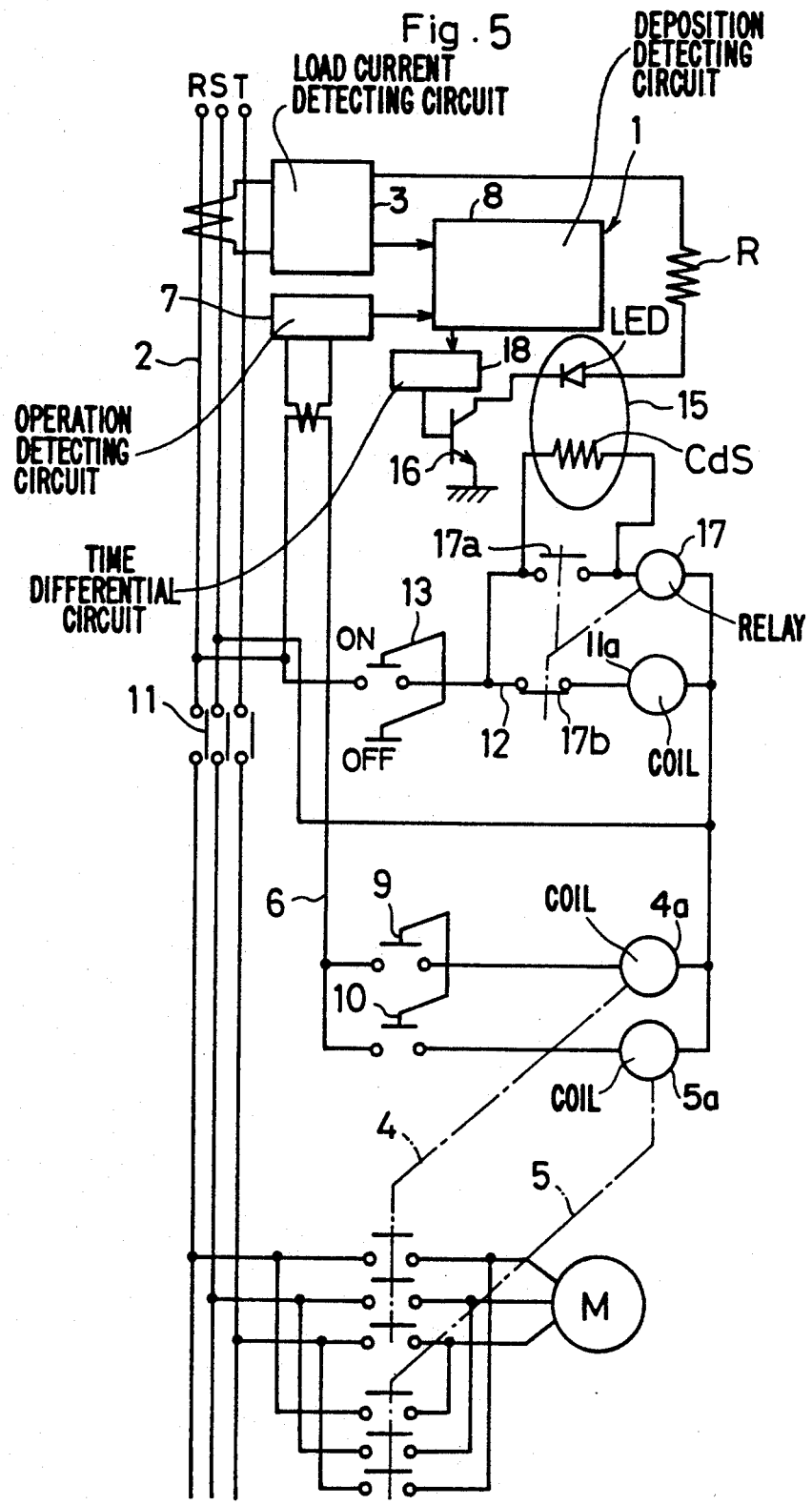
FIG. 5 is a circuit diagram of a deposition detecting apparatus of the fourth embodiment.

FIG. 5 shows the fourth embodiment of the present invention.

The electromagnetic contactor deposition detecting device 1 includes the load current detecting circuit 3 fitted to the power source circuit 2, an operation detecting circuit 7 for detecting a load, namely, an operation current of the electromagnetic contactors 4 and 5 to the driving motor M, and a deposition detecting circuit 8 which receives output signals from both detecting circuits 3 and 7. Reference numerals 9 and 10 respectively designate a push-button for rising and push-button for falling. Reference numerals 4a and 5a designate work coils of an electromagnetic contactor for rising and an electromagnetic contactor for falling, respectively. These coils are provided in the operation circuit 6. Reference numerals 11, 11a and 13 designate a main electromagnetic contactor provided in the power source circuit 2, a work coil provided in the operation circuit 12 for opening and closing the power source and a push-button switch for switching ON and OFF of the power source, respectively.

Outputs of the load current detecting circuit 3 act for the deposition detecting circuit 8 and a power source circuit of the non-contact switch 15. This non-contact switch 15 is composed of LED/CdS cells. The resistor R is connected to one side of the LED and the other side of LED is connected to a switch member, for example, a transistor 16.

The deposition detecting circuit 8 has a conventional construction, namely, when detection signals from both the load current detecting circuit 3 and the operation detecting circuit 7 are impressed or when both signals are not impressed, no output is generated, but when signals from the operation detecting circuit 7 ar stopped and only signals from the load current detecting circuit 3 are impressed, signals are issued and these output signals are impressed on the transistor 16, whereby the transistor 16 conducts and the LED emits light. Reference numeral 17 designates a relay for opening the work coil of the main electromagnetic contactor 11. The CdS is provided in parallels with the relay 17. Reference numerals 17a designates a self-holding contact which is normally opened (A contact) and reference numeral 17b designates a normally closed relay contact (B contact) provided in the operation circuit 12 for opening and closing the power source.

In the above composition, while the driving motor M is running normally, namely, in the case where the load current detecting circuit 3 detects an electric current of the power source circuit 2 and issues a signal, the operation detecting circuit 7 detects an operation current of the operation circuit 6 and issues a signal, and these signals are impressed upon the deposition detecting circuit 8, and in the case where the driving motor M stops and no signal is impressed upon the deposition circuit 8, the deposition detecting circuit 8 does not issue a signal.

However, in the case where deposition occurs at the electromagnetic contactor 4 or 5 and electric current flows in the driving motor M in spite of both of push buttons 9 and 10 being in an OFF state, namely, in the case where the operation detecting circuit 7 does not issues detection signals but the load current detecting circuit 3 issues signals and such signals are impressed on the deposition detecting circuit 8, the deposition detecting circuit 8 outputs signals. In this case, however, the deposition detecting circuit 8 is provided with the detection time differential circuit 18 which issues signals and impresses them on the switch member 16 when signals from the load current detecting circuit 3 continue for longer than a set time, whereby erroneous operations are prevented. It is preferable that the detection time differential setting circuit 18 is designed so that the set time can be set from the outside. After the lapse of the set time, an output signal is impressed on switch member 16, whereby the switch member 16 is put in a conductive state, the LED is lighted, the CdS is put in a conductive state by receiving light, the relay 17 is operated to close and hold the self-holding contact 17a and open the contact 17b of the power source opening and closing operation circuit 12. Thus, the main electromagnetic contactor 11 of the power source circuit 2 is opened.

Figure 6:
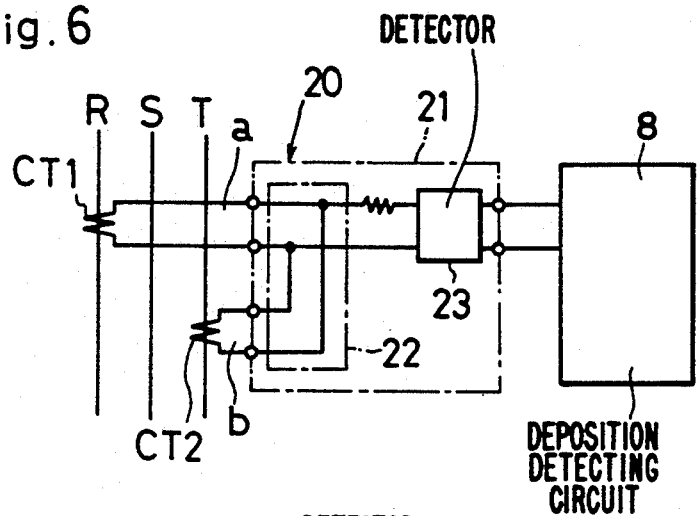
FIG. 6 is an electric circuit diagram, showing an example of a load current detecting circuit which detects two phases separately.

An example of the load current detecting circuit 3 is shown in FIG. 6. A load current detecting circuit 20 has current transformers CT1 and CT2 for two phases of the three-phase power source R, S and T phases (the R phase and T phase, for example) and a detecting circuit 21. The detecting circuit 21 is provided with a composite circuit 22 of output signals a and b from each current transformers CT1 and CT2 and a detector 23. The composite circuit 22 is a parallel circuit of both current transformer outputs. By this composite circuit 22, the vector sum of the output current of each current transformer CT1 and CT2 is input to the detector 23.

Figure 7:
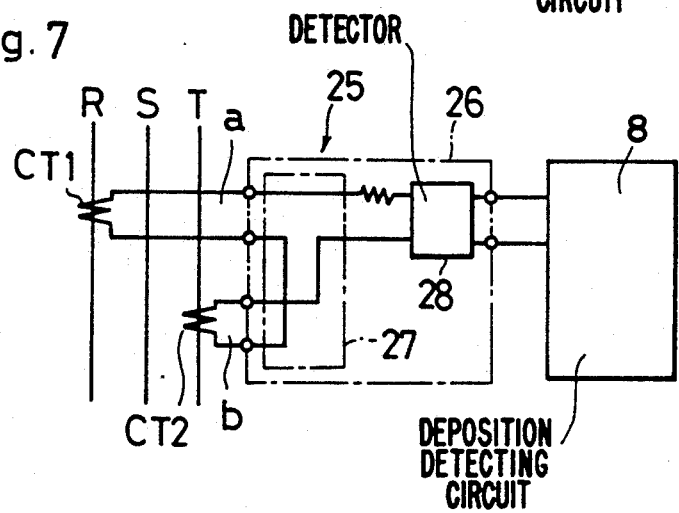
FIG. 7 is an electric circuit diagram, showing another example of a load current detecting circuit which detects two phases separately.

FIG. 7 shows another example of the load current detecting circuit. A load current detecting circuit 25, similar to the preceding example, has current transformers CT1 and CT2 provided for two phases (R phase and T phase) of three-phase power sources R, S and T and a detecting circuit 26. Similar to the preceding example, the detecting circuit 26 is provided with a composite circuit 27 of output circuits a and b from each current transformer CT1 and CT2 and a detector 28 for a combined output. In the composition circuit 27 of this embodiment, the output of each current transformer is arranged in series and therefore the vector sum of the output voltage of each current transformer CT1 and CT2 is input to the detector 28.

The load current detecting circuits 20 and 25 detect and output all of the conditions under which load current flows, including the case where one phase of the three-phase alternating current power source is open.

Figure 8:
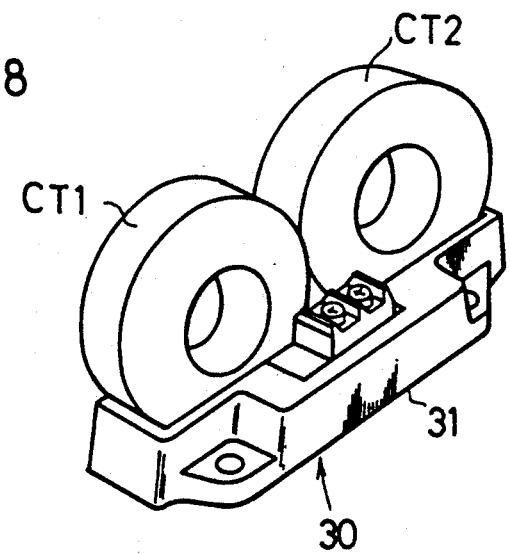
FIG. 8 is a perspective external view of the load current detecting circuit in FIG. 6 and FIG. 7.

FIG. 8 is a perspective view of a detecting member 30 which is a combination of the load current detecting circuit 20 (or 25) and the operation detecting circuit 21 (or 26). A composite circuit and a detector are provided in a base 31.

As stated above, according to the present invention, when an electromagnetic contactor provided in a driving circuit to a load has malfunctioned and the connecting state of a contact for one phase is inaccurate and does not properly conduct or when contacts for plural phases do not properly conduct, such malfunction is detected immediately by the detecting driving current sensor and the switch state of an operation switch, and the driving circuit is opened. Therefore, unforeseen accidents can be prevented.

Furthermore, even in the case where the driving circuit is a three-phase alternating current circuit, whether the conductivity of each phase is good or bad can be judged using a single sensor and therefore the construction of the apparatus can be made simple. Also, as the sensor of detecting driving current and the sensor for detecting operation current, a current transformer is used and the secondary side electric current is impressed upon a judging circuit as a detecting signal. Under this arrangement, even if high-tension heavy current is used for driving large processing machines, such as hoist cranes, electric power to be impressed upon the judging circuit is insulated electrically from the high-tension heavy current flowing in the driving circuit and thus safety is ensured.

The provisions of a detecting time differential circuit in the deposition detecting circuit for regulating the detecting time from the outside makes it possible to set the most suitable detecting time according to a time lag of the electromagnetic contactor so as to ensure accurate deposition detection.

In the second and third embodiments, the number of parts can be reduced to a large extent and accordingly miniaturization of the apparatus can be contemplated. This reduction in the number of parts involves reduction in the number of wirings in fitting the parts and improvement in reliability.

I claim:

1. An apparatus for detecting the deposition of an electromagnetic contactor which opens and closes a drive circuit connecting a power source to a load, said apparatus comprising:

a first sensor for detecting a load current of the drive circuit and for generating a corresponding first detection signal;

a second sensor for detecting an operating current applied to the electromagnetic contactor, the operating current controlling an opening and closing of the electromagnetic contactor, and for generating a corresponding second detection signal;

a deposition detecting circuit for receiving the first and second detection signals from the first and second sensors, for determining the deposition of the electromagnetic contactor based on the first and second detection signals, and for generating a corresponding deposition detection signal; and, a detecting time difference circuit which regulates the deposition detection signal generated by said deposition detecting circuit;

wherein said first sensor is composed of a first transformer which induces a first secondary current responsive to the load current, the first secondary current being applied to said deposition detecting circuit as said first detection signal;

wherein said second sensor is composed of a second transformer which induces a second secondary current responsive to the operating current, the second secondary current being applied to said deposition detecting circuit as said second detection signal;

wherein said deposition detecting circuit compares said first and second detection signals and generates a malfunction signal as the deposition detection signal when either of the first and second detection signals fluctuates independently of the other; and, wherein said detecting time difference circuit causes a switching device of the drive circuit to open the drive circuit when the malfunction signal is generated by said deposition detecting circuit for at least a preset period of time.

2. An apparatus as claimed in claim 1, wherein the drive circuit is a three-phase alternating current circuit, and wherein said first transformer includes respective conductor windings for phases of the three-phase alternating current circuit, the respective conductor windings having a different number of turns to discriminate the load current of each of the respective phases.

3. An apparatus for detecting the deposition of an electromagnetic contactor which opens and closes a drive circuit connecting a power source to a load, said apparatus comprising:

a load current sensor for detecting a load current of the drive circuit and for generating a corresponding first detection signal;

an operating current sensor for detecting an operating current applied to the electromagnetic contactor, the operating current controlling an opening and closing of the electromagnetic contactor, and for generating a corresponding second detection signal;

a deposition detecting circuit for receiving the first and second detection signals from the first and second sensors, for determining the deposition of the electromagnetic contactor based on the first and second detection signals, and for generating a corresponding deposition detection signal;

a detecting time difference circuit which regulates the deposition detection signal generated by said deposition detecting circuit;

a non-contact switch responsive to said detecting time difference circuit; and, a relay for being held in an open state for opening the drive circuit responsive to said non-contact switch;

wherein said deposition detecting circuit compares said first and second detection signals and generates a malfunction signal as the deposition detection signal when only the first detection signal is received in the absence of the second detectio signal; and, wherein said detecting time difference circuit causes the non-contact switch to hold said relay in an open state when the malfunction signal is generated by said deposition detecting circuit for at least a preset period of time.

4. An apparatus as recited in claim 3, wherein said non-contact switching is composed of an LED and a CdS, said LED being provided on an output side of said deposition detecting circuit, said CdS being provided in series with said relay, and wherein said deposition detecting circuit causes said LED to emit light to in turn cause the CdS to conduct current.

5. An apparatus as recited in claim 3, wherein the drive circuit is a three-phase alternating current circuit, and wherein said load current sensor includes two current transformers respectively provided in two phases of the drive circuit, a composing circuit which composes the outputs of said two current transformers, and a detecting circuit which detects the conductivity of the load circuit from an output of said composing circuit.

* * * * *